(12) United States Patent
Kim

(10) Patent No.: US 7,755,201 B2
(45) Date of Patent: Jul. 13, 2010

(54) SEMICONDUCTOR DEVICE AND METHOD OF FABRICATING THE SAME

(75) Inventor: Dae-ik Kim, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 39 days.

(21) Appl. No.: 11/975,159

(22) Filed: Oct. 18, 2007

(65) Prior Publication Data
US 2008/0093714 A1    Apr. 24, 2008

(30) Foreign Application Priority Data
Oct. 23, 2006  (KR) .................. 10-2006-0103024

(51) Int. Cl.
*H01L 23/52* (2006.01)
(52) U.S. Cl. .................. 257/774; 257/775; 257/666
(58) Field of Classification Search .............. 257/666, 257/774, 775, 304
See application file for complete search history.

(56) References Cited

U.S. PATENT DOCUMENTS

| | | | |
|---|---|---|---|
| 6,168,984 B1 * | 1/2001 | Yoo et al. | 438/239 |
| 6,268,252 B1 | 7/2001 | Lee et al. | |
| 6,285,053 B1 * | 9/2001 | Park | 257/306 |
| 6,693,360 B1 * | 2/2004 | Dei et al. | 257/774 |
| 6,730,570 B2 | 5/2004 | Shin et al. | |
| 6,744,096 B2 * | 6/2004 | Lee et al. | 257/316 |
| 2002/0027288 A1 * | 3/2002 | Lee et al. | 257/758 |

FOREIGN PATENT DOCUMENTS

| | | |
|---|---|---|
| JP | 2000-208629 | 7/2000 |
| KR | 10-2004-0008687 A | 1/2004 |
| KR | 1020040008687 A | 1/2004 |
| KR | 10-2004-0015588 A | 2/2004 |
| KR | 1020040015588 A | 2/2004 |
| KR | 1020040026334 A | 3/2004 |
| KR | 1020050003297 A | 1/2005 |

* cited by examiner

*Primary Examiner*—Wai-Sing Louie
*Assistant Examiner*—Bilkis Jahan
(74) *Attorney, Agent, or Firm*—Mills & Onello, LLP

(57) ABSTRACT

A semiconductor device and method of fabricating the same reduce the likelihood of the occurrence of electrical defects. The device includes a first interlayer insulating film on a semiconductor substrate; a contact pad spacer on the first interlayer insulating film; and a contact pad in the first interlayer insulating film and the contact pad spacer. The cross-sectional area of an upper portion of the contact pad in the contact pad spacer in a direction horizontal to the substrate is equal to or less than a cross-sectional area of an intermediate portion at an interface between the contact pad spacer and the first interlayer insulating film in a direction horizontal to the substrate.

16 Claims, 11 Drawing Sheets

SEMICONDUCTOR DEVICE AND METHOD OF FABRICATING THE SAME

CROSS REFERENCE TO RELATED APPLICATION

This application claims priority to Korean Patent Application No. 10-2006-0103024 filed on Oct. 23, 2006 in the Korean Intellectual Property Office, the disclosure of which is incorporated herein by reference in its entirety.

BACKGROUND OF THE INVENTION

1. Field of the Invention

The present invention relates to a method of fabricating a semiconductor device and a semiconductor device fabricated by the method and, more particularly, to a semiconductor device capable of reducing electrical defects and a method of fabricating the semiconductor device.

2. Description of the Related Art

As integration of a semiconductor devices continues to be enhanced, the size of contact holes serving as connections between devices or layers decreases while the thickness of an interlayer insulating film increases. Therefore, as the aspect ratio of a contact hole increases, the alignment margin of a contact hole decreases during a photolithography process.

In particular, the margin narrows between a buried contact (BC) that is a storage node contact and a contact pad (DC pad) that is located below a Direct Contact (DC) connected to a bit line, that is, a bit line contact pad, thus increasing the likelihood of device failure due to shorting.

SUMMARY OF THE INVENTION

Embodiments of the present invention serve the purpose of improving the margin between a storage node contact and a bit line contact pad, thereby reducing the likelihood of device failure.

Embodiments of the present invention provide a semiconductor device capable of reducing electrical defects.

Embodiments of the present invention further provide a method of fabricating a semiconductor device in manner that reduces electrical defects.

Objects of the embodiments of the present invention are not limited to those mentioned above, and other objects will be apparently understood by those skilled in the art through the following description.

In one aspect, a semiconductor device includes a first interlayer insulating film on a semiconductor substrate; a contact pad spacer on the first interlayer insulating film; and a contact pad in the first interlayer insulating film and the contact pad spacer. The cross-sectional area of an upper portion of the contact pad in the contact pad spacer in a direction horizontal to the substrate is equal to or less than a cross-sectional area of an intermediate portion at an interface between the contact pad spacer and the first interlayer insulating film in a direction horizontal to the substrate.

In one embodiment, a side surface of the upper portion of the contact pad formed in the contact pad spacer is perpendicular to the substrate.

In another embodiment, a cross-section of the upper portion of the contact pad formed in the contact pad spacer in a direction perpendicular to the substrate has a trapezoidal shape.

In another embodiment, the semiconductor device further comprises: a second interlayer insulating film on the spacer and the contact pad; a bit line contact hole in the second interlayer insulating film; a bit line on the second interlayer insulating film and electrically connected to a bit line contact plug embedded in the bit line contact hole; a third interlayer insulating film on the bit line; a storage node contact hole in the second interlayer insulating film and the third interlayer insulating film; and a storage node plug embedded in the storage node contact hole.

In another embodiment, an interface between the bit line contact plug embedded in the bit line contact hole and the contact pad is a substantially uniform, flat surface.

In another embodiment, a side surface of the upper portion of the contact pad formed in the contact pad spacer is substantially perpendicular to the substrate.

In another embodiment, a cross-section of the upper portion of the contact pad in the contact pad spacer in a direction perpendicular to the substrate has a trapezoidal shape.

In another embodiment: at least a portion of the bit line contact hole extends into the contact pad spacer, and the bit line contact plug is embedded in the partially extended bit line contact hole, and surrounds the contact pad in the contact pad spacer.

In another embodiment, a side surface of the contact pad formed in the contact pad spacer is substantially perpendicular to the substrate.

In another embodiment, a cross-section of the contact pad formed in the contact pad spacer in a direction perpendicular to the substrate has a trapezoidal shape.

In another embodiment, the contact pad spacer is formed of a nitride film.

In another aspect, a method of fabricating a semiconductor device comprises: forming a first interlayer insulating film on a semiconductor substrate; forming a contact pad in the first interlayer insulating film; exposing an upper portion of the contact pad by partially recessing the first interlayer insulating film; and reducing the upper portion of the contact pad in size by reducing a size of the exposed contact pad.

In one embodiment, the exposed contact pad is reduced in size such that a cross-sectional area of a portion of the contact pad formed in the contact pad spacer in a direction horizontal to the substrate is equal to or less than a cross-sectional area of a portion formed on an interface between the contact pad spacer and the first interlayer insulating film in a direction horizontal to the substrate.

In another embodiment, the method further comprises forming a contact pad spacer on the recessed first interlayer insulating film between the reduced contact pads, after the reduction of the size of the exposed contact pad.

In another embodiment, the contact pad spacer is formed of a nitride film.

In another embodiment, the method further comprises: forming a second interlayer insulating film on the contact pad and the contact pad spacer; forming a bit line contact hole in the second interlayer insulating film; forming a bit line contact plug by filling the bit line contact hole; forming a bit line electrically connected to the bit line contact plug on the second interlayer insulating film; forming a third interlayer insulating film on the bit line; forming a storage node contact hole in the second interlayer insulating film and the third interlayer insulating film; and forming a storage node plug by filling the storage node contact hole.

In another embodiment, in the forming of the bit line contact plug, the interface between the bit line contact plug embedded in the bit line contact hole and the contact pad has a uniform flat surface.

In another embodiment, a side surface of the upper portion of the contact pad, after the reduction of the size of the exposed contact pad, is substantially perpendicular to the substrate.

In another embodiment, a cross-section of the contact pad, after the reduction of the size of the exposed contact pad, in a direction perpendicular to the substrate, has a trapezoidal shape.

In another embodiment: in the forming of the bit line contact hole, at least a portion of the bit line contact hole is extended into the second interlayer insulating film and the contact pad spacer; and in the forming of the bit line contact plug, the partially extended bit line contact hole is filled to surround the reduced-size contact pad formed in the contact pad spacer.

In another embodiment, a side surface of the upper portion of the contact pad, after the reduction of the size of the exposed contact pad, is substantially perpendicular to the substrate.

In another embodiment, a cross-section of the contact pad, after the reduction of the size of the exposed contact pad, in a direction perpendicular to the substrate, has a trapezoidal shape.

In another embodiment, the reduction of the size of the exposed contact pad is performed by an isotropic etching.

In another embodiment, a side surface of the upper portion of the contact pad, after the reduction of the size of the exposed contact pad, is perpendicular to the substrate.

In another embodiment, the cross-section of the contact pad, after the reduction of the size of the exposed contact pad, in a direction perpendicular to the substrate, has a trapezoidal shape.

BRIEF DESCRIPTION OF THE DRAWINGS

The above and other features and advantages of the embodiments of the present invention will become more apparent by describing in detail preferred embodiments thereof with reference to the attached drawings in which.

DETAILED DESCRIPTION OF EMBODIMENTS

Figure 1:
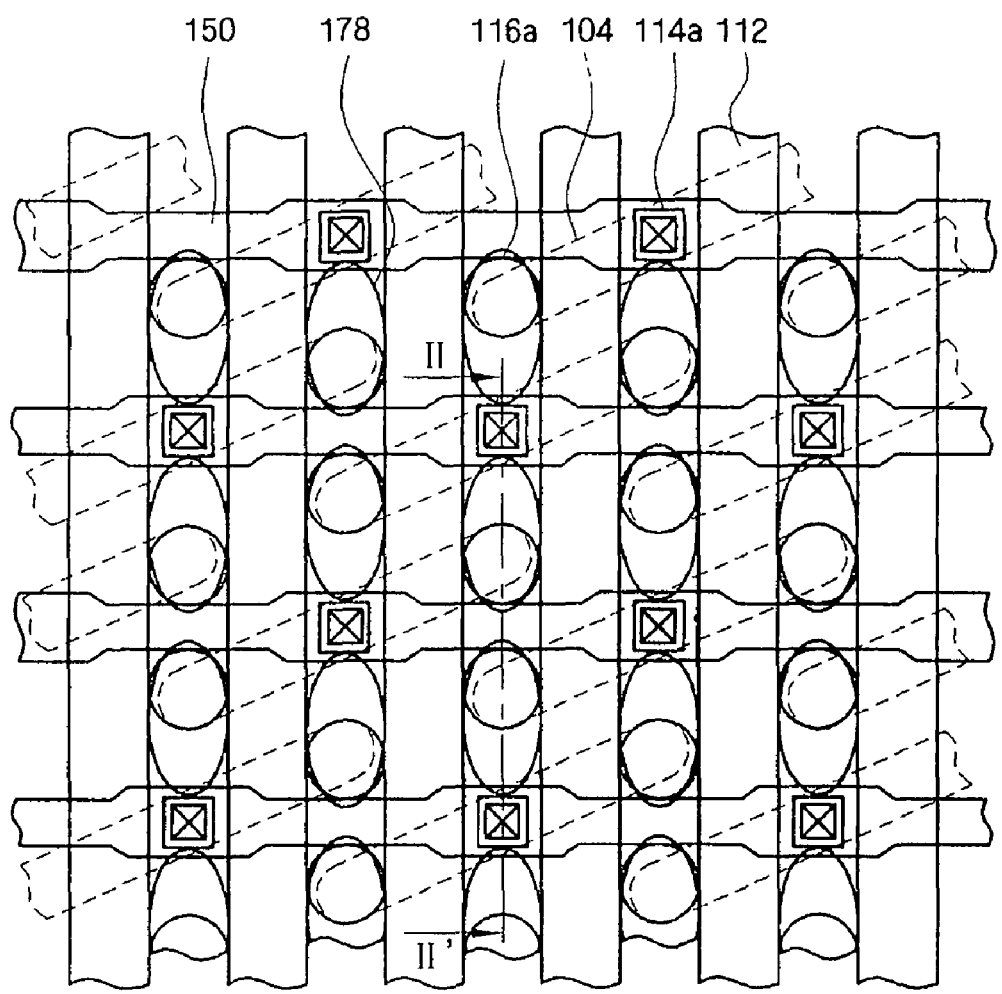
FIG. 1 is a layout view of a semiconductor device according to a first embodiment of the invention.

Advantages and features of the embodiments of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete, and the present invention will only be defined by the appended claims. Like reference numerals refer to like elements throughout the specification.

Hereinafter, a first embodiment of the invention will be described in detail with reference to the accompanying drawings.

First, a semiconductor device according to the first embodiment of the invention will be described in detail with reference to FIGS. 1 and 2.

FIG. 1 is a layout view of a semiconductor device according to the first embodiment of the invention. FIG. 2 is a cross-sectional view of the semiconductor device according to the first embodiment of the invention taken along section line II-II' of FIG. 1.

Figure 2:
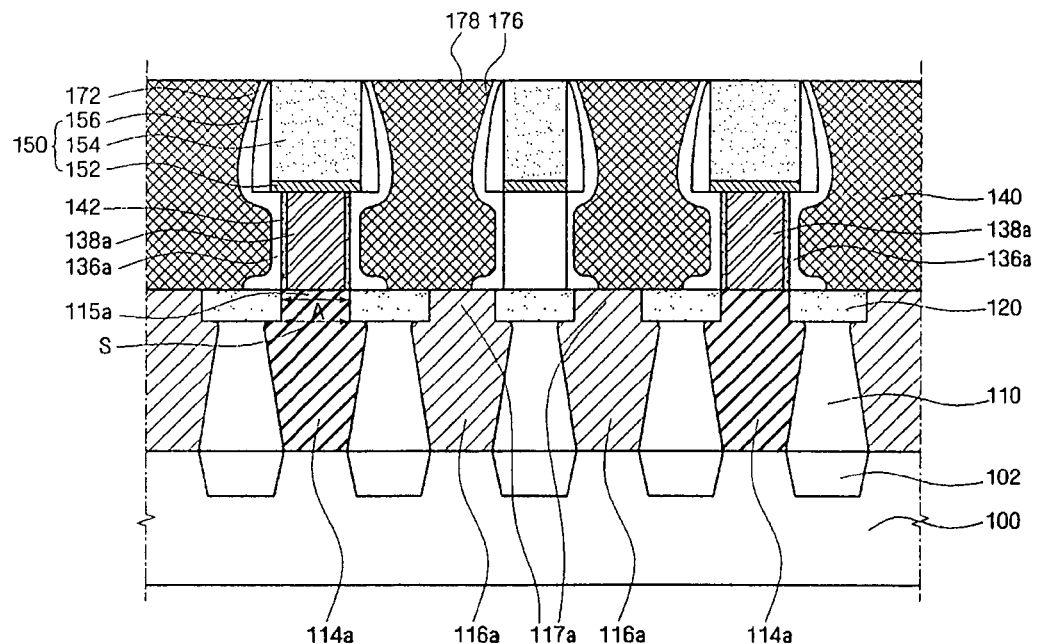
FIG. 2 is a cross-sectional view of the semiconductor device according to the first embodiment of the invention taken along section line II-II' of FIG. 1.

As shown in FIGS. 1 and 2, in a semiconductor substrate 100, an active region 104 is defined by an element isolation film 102, and a plurality of gate lines 112 is located to extend in one direction on the semiconductor substrate 100. An impurity region (not shown) is formed inside the active region 104 at both sides of the gate lines 112. Here, the gate lines 112 each include a gate insulating film, a gate conductive film, a gate capping film and a spacer.

A first interlayer insulating film 110 is formed on the substrate 100 where the gate lines 112 are formed, and a contact pad spacer 120 is formed on the first interlayer insulating film 110. The first interlayer insulating film 110 may be formed, for example, of material selected from a silicon oxide film, such as BSG (Borosilicate Glass), PSG (PhosphoSilicate Glass), BPSG (BoroPhosphoSilicate Glass), PE-TEOS (Plasma Enhanced Tetra Ethyl Ortho Silicate) or HDP (High Density Plasma). The contact pad spacer 120 may be formed of, for example, silicon nitride (SiN) or silicon oxynitride film, which is not intended to be limitative, but illustrative.

Contact pads 114a and 116a are formed inside the first interlayer insulating film 110 and the contact pad spacer 120 between the gate lines 112. Hereinafter, among the contact pads 114a and 116a, portions formed inside the contact pad spacer 120 are indicated by contact pad upper portions 115a and 117a. Particularly, in a bit line contact pad 114a, a portion 115a formed inside the contact pad spacer 120 is related to the embodiments of the present invention, thus, the present description is primarily focused on this portion 115a. Among contact pads 114a and 116a, the cross-sectional area of a first portion formed between neighboring contact pad spacers 120 cut horizontal with respect to the substrate 100 may be substantially equal to the cross-sectional area of a second portion formed at an interface between the contact pad spacer 120 and a first interlayer insulating film 110 cut horizontal with respect to the substrate 100. In this case, the side surface of the contact pad upper portion 115a may be perpendicular to the substrate 100.

In other words, as shown in FIG. 2, in the cross-sectional view of the semiconductor device taken along the line II-II' of FIG. 1, a cross-sectional width A of the bit line contact pad 114a formed inside the contact pad spacer 120 may be equal to a cross-sectional width S of the contact pad formed on the interface between the contact pad spacer 120 and the first interlayer insulating film 110 cut horizontal with respect to the substrate 100.

The contact pads 114a and 116a are formed of conductive material doped with impurity, such as polysilicon, or metallic material. The contact pads 114a and 116a may be Self-Aligned Contact pads (SAC) with respect to the gate line 112. The contact pads may be classified into the bit line contact pad 114a that is electrically connected to a bit line 150 and the storage node contact pad 116a that is electrically connected to a storage node (not shown).

A second interlayer insulating film 130 (see FIG. 12 below) is located on the contact pads 114a and 116a and the contact pad spacer 120, and bit line contact holes 136a are formed therein (see FIG. 13 below) so that bit line contact plugs 138a can be formed in the holes 136a electrically connected to the bit line contact pad 114a. The bit line contact hole 136a and the bit line contact plug 138a embedded in the bit line contact hole 136a may be formed on the bit line contact pad 114a. To be more specific, an interface between the bit line contact plug 138a embedded in a bit line contact hole 136a and the contact pad 114a has a uniform flat surface. To cause the interface between the bit line contact plug 138a and the contact pad 114a to have a uniform flat surface, the bit line contact hole 136a and the bit line contact plug 138a are aligned, and formed on the uppermost surface of the bit line contact pad 114a. As a result, as the bit line contact pad 114a decreases in area, so as to have the same size as the bit line contact plug 138a, a margin is ensured between the bit line contact pad 114a and storage node contacts 176 and 178 to be described below, thus reducing the likelihood of electrical defects.

A bit line contact spacer 142 may be formed at an inner wall of the bit line contact hole 136a. The bit line contact spacer 142 may be formed, for example, of nitride.

The bit line contact plug 138a is formed of conductive material inside the bit line contact hole 136a having the bit line contact spacer 142 at the inner wall. In a case where the bit line contact plug 138a is formed of a metal film, a metal barrier film (not shown) may be located at the lower side of the metal film. In this case, since a metal barrier film is in contact with the bit line contact pad 114a, a metal silicide film (not shown) is formed on an interface between the metal barrier film and bit line contact pad 114a.

Next, at an upper side of the second interlayer insulating film 130 (see FIG. 12 below) the gate line 112 and the plurality of bit lines 150 extending vertically are formed in connection to the bit line contact plug 138a. In the bit line 150, a bit line conductive film 152 and a bit line capping film 158 are laminated, and a spacer 156 is located at the side wall. In this case, the bit line conductive film 152 may be formed of a barrier metal film and a metal film. Here, a bit line conductive film 152 may be a metal film, like the bit line contact plug 138a.

A third interlayer insulating film 160 (see FIG. 16 below) may be provided on the bit line 150. A storage node contact hole 176 is formed through the second interlayer insulating film 130 and the third interlayer insulating film to expose the storage node contact pad 116a. The storage node contact hole 176 is formed to increase an exposed area of the storage node contact pad 116a. That is, the storage node contact hole 176 may be formed inside the second interlayer insulating film 130 to be exposed up to the bit line contact spacer 142 of the bit line contact plug 138a. In this case, the bit line contact pad 114a adjacent to the storage node contact pad 116a is prevented from being exposed by the bit line contact spacer 142 and the contact pad spacer 120.

A storage node contact spacer 172 may be formed at the inner wall of the storage node contact hole 176. A bridge phenomenon is prevented from occurring between storage node contact plugs 178 by the presence of the storage node contact spacer 172. The storage node contact plugs 178 are formed of conductive material filling the storage node contact hole 176 having the storage node contact spacer 172 formed at the inner side thereof.

It has been described above that the contact pads 114a and 116a, particularly, the bit line contact pad 114a is formed in such a shape that the cross-section area of the contact pad upper portion 115a cut horizontal with respect to the substrate 100 may be equal to the cross-section area of the portion formed on the interface between the contact pad spacer 120 and the first interlayer insulating film 110 cut horizontal with respect to the substrate 100. With this structure, it is possible to improve electrical defects such as short failures by sufficiently ensuring a spatial margin between the bit line contact pad 114a and the storage node contact plug 178.

Hereinafter, other embodiments of the present invention will be described with reference to FIGS. 3 to 5.

Figure 3:
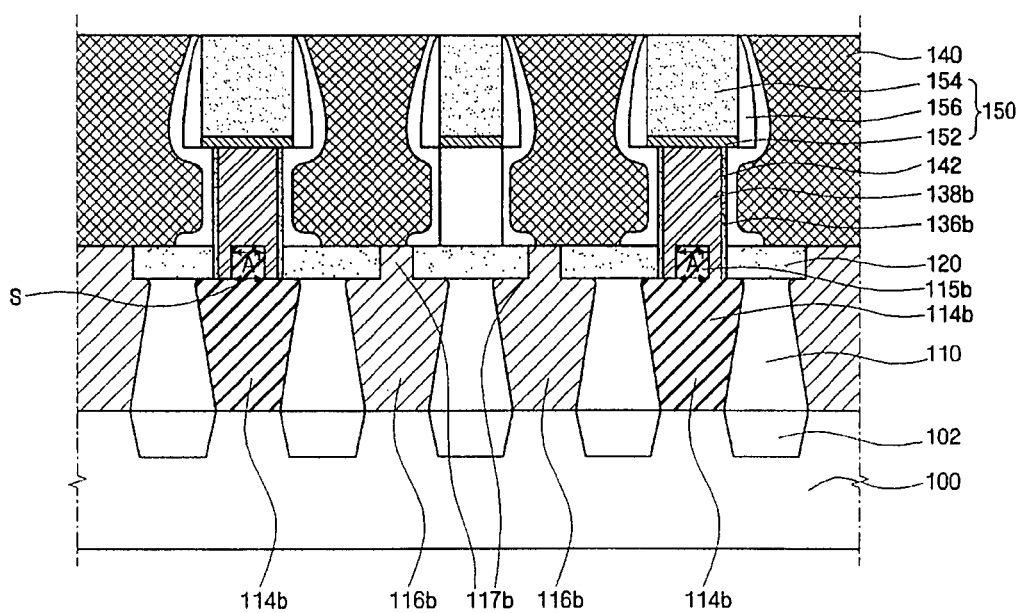
FIG. 3 is a cross-sectional view of a semiconductor device according to a second embodiment of the invention.
Figure 4:
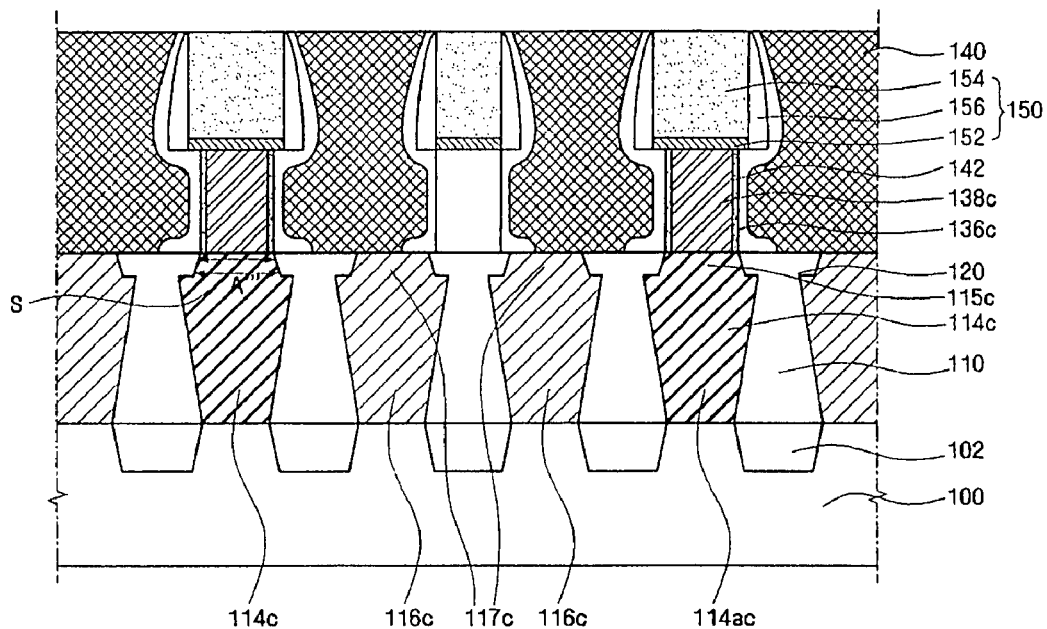
FIGS. 4 and 5 are cross-sectional views of a semiconductor device according to another embodiment of the invention.
Figure 5:
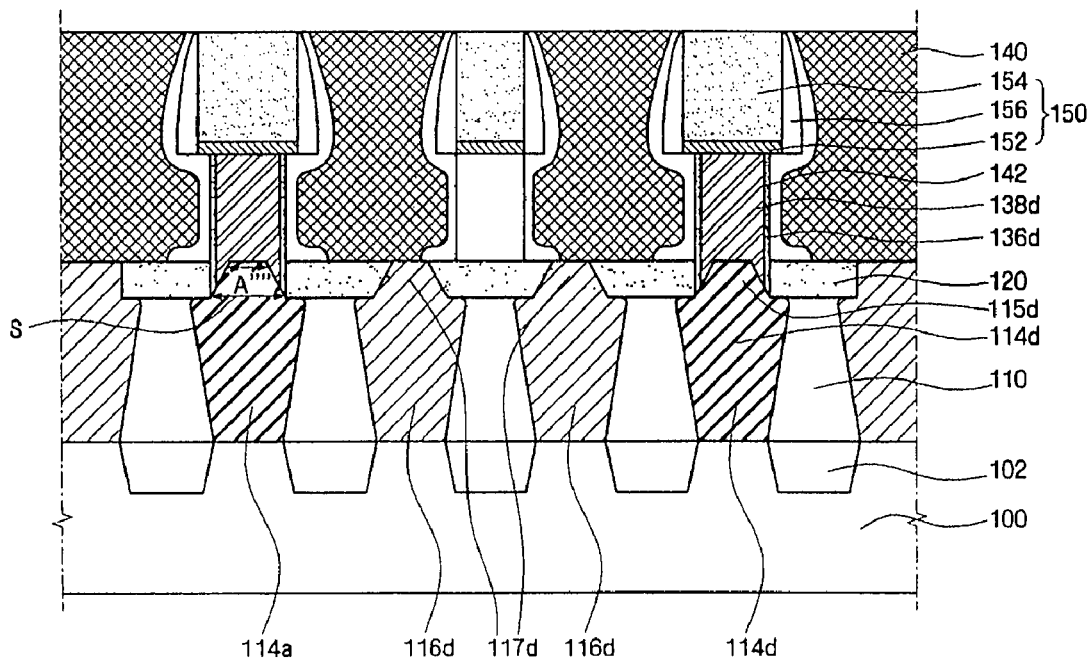

FIGS. 3 to 5 are cross-sectional views of a semiconductor device according to other embodiments of the invention. For the sake of convenience, the same components as those of the first embodiment are denoted by the same reference numerals, and the description thereof will be omitted. The semiconductor device according to other embodiments of the invention basically has the same structure as the semiconductor device according to the first embodiment of the invention shown in FIG. 2, except for the following description.

To describe another embodiment with reference to FIG. 3, in a semiconductor device according to a second embodiment of the invention, a contact pad upper portion 115b according to the second embodiment may be smaller than the contact pad upper portion 115a according to the first embodiment of the invention. As a result, although the size of a bit line contact hole 136b is equal to the size of the bit line contact hole 136a according to the first embodiment of the invention, the bit line contact hole 136b is not formed at the contact pad upper portion 115b, but formed so as to include the contact pad upper portion 115b and surround the outline of the upper portion 115b. That is, the bit line contact hole 136b, as shown in the drawing, is formed so as to be recessed into the contact pad spacer 120 surrounding the bit line contact pad upper portion 115b by a predetermined depth. In other words, at least a portion of the bit line contact hole 136b extends into the region of the contact pad spacer 120, and, as a result, a bit line contact plug 138b that is formed by filling the bit line contact hole 136b surrounds the contact pad upper portion 115b inside the contact pad spacer 120. The contact pad spacer 120 surrounds the bit line contact hole 136b and the bit line contact plug 138b.

As a result, the area of interface between the bit line contact hole 136b and the contact pad upper portion 115b can be increased, as compared to the first embodiment of the invention. The interface between the bit line contact pad upper portion 115b that is a part of the bit line contact pads 114b, particularly, among contact pads 114b and 116b, and the bit line contact hole 136b may increase, thereby reducing resistance.

With reference to FIG. 4, a semiconductor device according to a third embodiment of the invention will be described. The third embodiment is different from the first embodiment in that the cross-section of the structure of a contact pad upper portion 115c cut perpendicular with respect to the substrate 100 has a trapezoidal shape, as compared to the contact pad upper portions 115a and 117a according to the first embodiment of the invention. The cross-sectional area of the contact pad upper portion 115c may gradually decrease with increased distance from the substrate 100. That is, among contact pads 114c and 116c, the cross-sectional area of a portion formed inside the contact pad spacer 120 cut horizontal with respect to the substrate 100 may be smaller than the cross-sectional area of a portion formed at an interface between the contact pad spacer 120 and the first interlayer insulating film 110 cut horizontal with respect to the substrate 100.

With reference to FIG. 5, a semiconductor device according to a fourth embodiment of the invention will be described. The fourth embodiment is different from the second embodiment in that the cross-section of the structure of a contact pad upper portion 115d cut perpendicular with respect to the substrate 100 has a trapezoidal shape, as compared to the contact pad upper portion 115b according to the second embodiment of the invention. Similar to the contact pad 115b according to the second embodiment of the invention, at least a portion of a bit line contact hole 136d extends into the contact pad spacer 120. As a result, a bit line contact plug 138d is embedded in the bit line contact hole 136d, partially extending, so as to surround a contact pad 115d formed inside the contact pad spacer 120.

However, unlike the contact pad upper portion 115b according to the second embodiment of the invention, the cross-sectional area of the contact pad upper portions 115d and 117d decreases with increased distance from the substrate 100. That is, among contact pads 114d and 116d, the cross-sectional area of a portion formed inside the contact pad spacer 120 cut horizontal with respect to the substrate 100 may be smaller than the cross-section area of a portion formed on an interface between the contact pad spacer 120 and the first interlayer insulating film 110 cut horizontal with respect to the substrate 100. As such, when the cross-section of the pad upper portion 115d cut perpendicular with respect to the substrate 100 is a trapezoidal shape, the interface between a bit line contact plug 138d and a bit line contact pad upper portion 115d increases, thus reducing resistance.

Hereinafter, with reference to FIGS. 1, 2, and 6 to 18, a method of fabricating the semiconductor device according to the first embodiment of the invention will be described in detail. FIGS. 6 to 14 are cross-sectional views sequentially illustrating a method of fabricating the semiconductor device according to the embodiments of the invention. When describing the method of fabrication, detailed description of known processes incorporated herein will be omitted. The same constituent elements of FIGS. 6 to 18 as those in FIGS. 1 and 2 are denoted by the same reference numerals.

Figure 6:
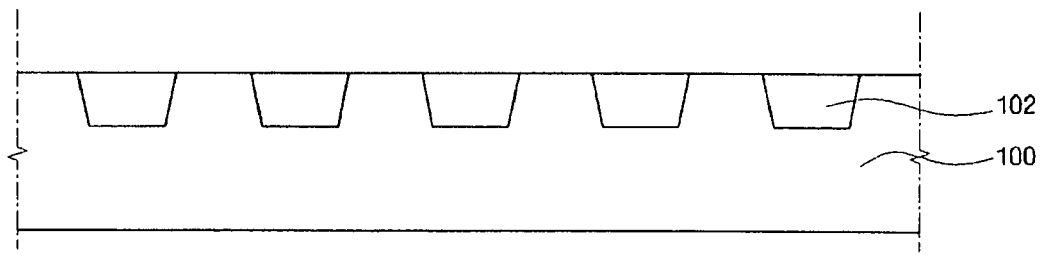
FIGS. 6 to 18 are cross-sectional views sequentially illustrating a method of fabricating the semiconductor device of FIG. 2.

First, as shown in FIG. 6, an LOCOS (Local Oxidation of Silicon) process or an STI (Shallow Trench Isolation) process are performed to form the element isolation film 102 which defines the active region 104.

Next, the plurality of gate lines 112 is formed to cross the active region 104 and extend in one direction on the semiconductor substrate 100 in which the active region 104 is defined.

The formation of the gate lines 112 is completed by laminating a gate insulating film (not shown), a gate conductive film (not shown) and a gate capping film (not shown) on the semiconductor substrate 100 and patterning them, and forming a spacer (not shown) at both side walls.

Afterwards, impurities are implanted into the active region 104 at both sides of the gate line 112 by using the gate line 112 as an ion implantation mask to form impurity regions (not shown). Accordingly, formation of a general transistor is completed.

Figure 7:
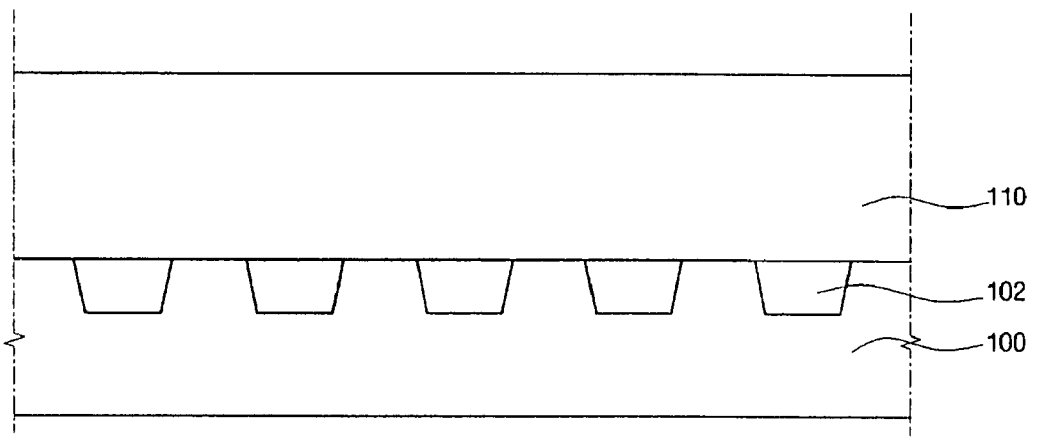

Next, as shown in FIG. 7, insulating material is deposited on the entire surface of the semiconductor substrate 100 in which the gate lines 112 are formed, and the upper surface is planarized by performing a CMP (Chemical Mechanical Polishing) process or an etch back process, thereby forming the first interlayer insulating film 110.

Figure 8:
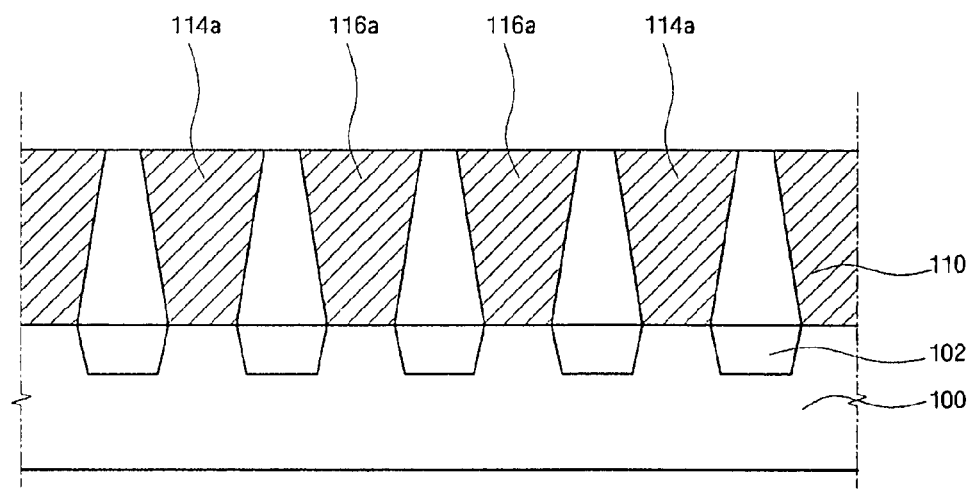

Next, as shown in FIG. 8, a general photolithography process is performed on the first interlayer insulating film 110 to form a contact hole through which the impurity region (not shown) in the semiconductor substrate 100 is exposed. Here, when a contact hole is formed in the first interlayer insulating film 110 that is formed of silicon oxide, contact holes are self-aligned with respect to the gate line 112 by using etch gas having a higher etch selection ratio than the gate line 112, thus exposing the impurity region (not shown) in the semiconductor substrate 100.

Next, conductive material such as polysilicon that is highly doped with impurity or metallic material is deposited on the entire surface of the first interlayer insulating film 110 in which a contact hole is formed, thereby forming a conductive film filling the contact hole. Next, the conductive film is planarized until the upper side of the first interlayer insulating film 110 is exposed, so as to form the contact pads 114a and 116a which are self aligned inside the first interlayer insulating film 110. The contact pad may be divided into the bit line contact pad 114a or the storage node contact pad 116a according to a subsequent process.

In the process of forming the contact pads 114a and 116a inside the first interlayer insulating film 110, in the case of using a self-alignment contact manufacture technique, the contact area can be decreased by an etch slope, as it becomes closer to the substrate 100. Therefore, as they extend closer to their lower portions, the area of the contact pads 114a and 116a is decreased.

Figure 9:
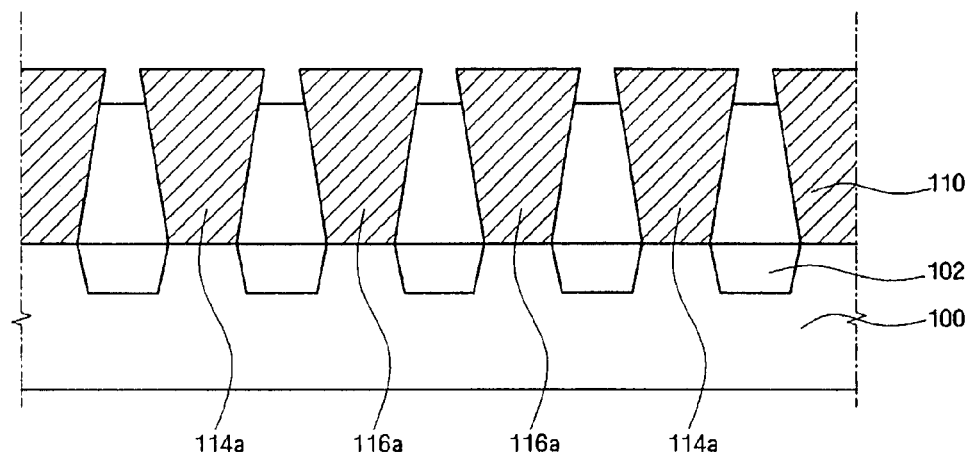

As shown in FIG. 9, as the first interlayer insulating film 110 is recessed by etching the upper side of the first interlayer insulating film 110, the upper side of the contact pads 114a and 116a is exposed. The etching of the upper side of the first interlayer insulating film 110 is performed, for example, by a dry etching and/or a wet etching.

In this case, a wet etching is performed on the first interlayer insulating film 110 such that the first interlayer insulating film is recessed to the depth in the range of 500 to 600 Å from the surface of the contact pads 114a and 116a. The first interlayer insulating film 110 may be etched in one embodiment by using a mixed solution of hydrofluoric acid solution (HF) or ammonia ($NH_4OH$), hydrogen peroxide ($H_2O_2$), and deionized water. Accordingly, the contact pads 114a and 116a relatively protrude in a vertical direction relative to the first interlayer insulating film 110, and outer walls of the upper side of the contact pads 114a and 116a are partially exposed.

When the first interlayer insulating film is recessed by a dry etching, an etch back process, or the like, may be used.

As shown in FIG. 9, after the first interlayer insulating film 110 is recessed, the cross-section of the upper side of the contact pads 114a and 116a cut perpendicular with respect to the substrate 100 may have a trapezoidal shape. As shown in FIG. 8, the contact area of the contact pads 114a and 116a may be decreased in accordance with the etch slope as the height becomes closer to the substrate 100 by the self-alignment contact manufacture technique, such that the contact area may decrease as it becomes closer to the upper side or lower side of the contact pad after the first interlayer insulating film 110 is recessed.

Figure 10:
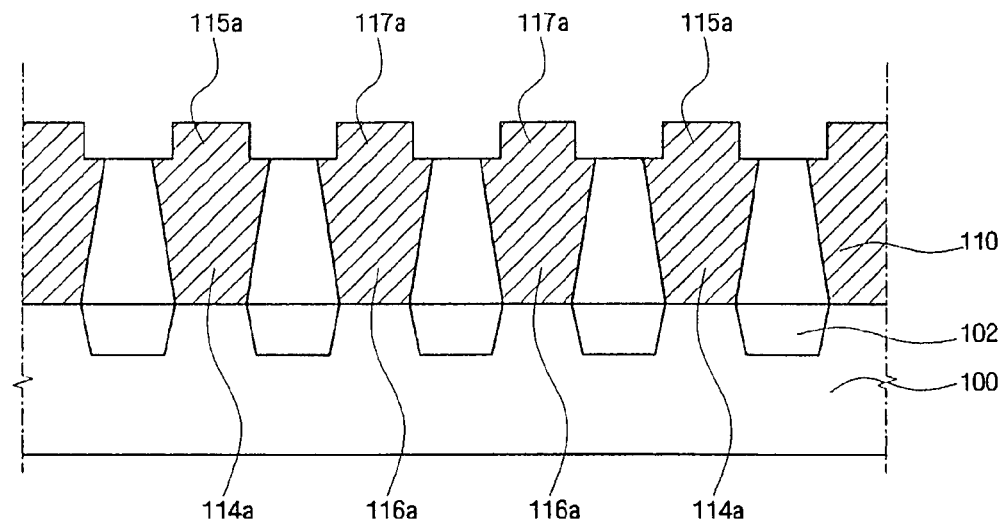

Afterwards, as shown in FIG. 10, the exposed contact pads 114a and 116a are reduced in size, in order to reduce the size of the upper surface of the contact pads 114a and 116a. The reduction may be performed by an isotropic etching, for example, or by a dry etching or a wet etching. The reduction of the size of the exposed contact pads 114a and 116a is performed such that the cross-section area of the contact pad upper portions 115a and 117a formed in the contact pad spacer 120 cut horizontal with respect to the substrate 100 is equal to the cross-section area of a portion formed on an interface between the contact pad spacer 120 and the first interlayer insulating film 110 cut horizontal with respect to the substrate 100. In other words, after the reduction of the size, the side surface of the contact pad upper portions 115a and 117a may be perpendicular to the substrate 100.

To be more specific, after the first interlayer insulating film 110 is recessed, the upper side of the exposed contact pads 114a and 116a may have a trapezoidal shape. In this case, an edge portion which is protruded by the etching during downsizing in size may be excessively etched. That is, during downsizing in size, the edge portion having a large protrusion is etched more rapidly, while other portions are etched to a lesser degree. Thus, the resulting shape of the contact pad upper portions 115a and 117a may be perpendicular to the substrate 100 in its final form.

Figure 11:
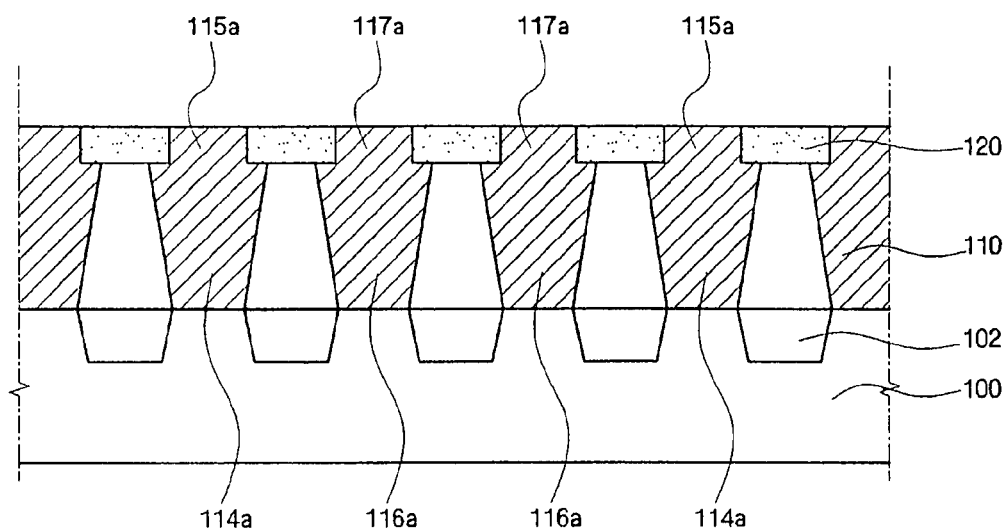

Afterwards, as shown in FIG. 11, after downsizing the size of the exposed contact pads 114a and 116a, the contact pad spacer 120 is formed on the recessed first interlayer insulating film 110 between the downsized contact pads, that is, the contact pad upper portions 115a and 117a. The contact pad spacer 120 may be formed of a nitride film to have a predetermined thickness. The contact pad spacer 120 may be formed of silicon nitride film (SiN) or silicon oxynitride film (SiON) or the like.

Figure 12:
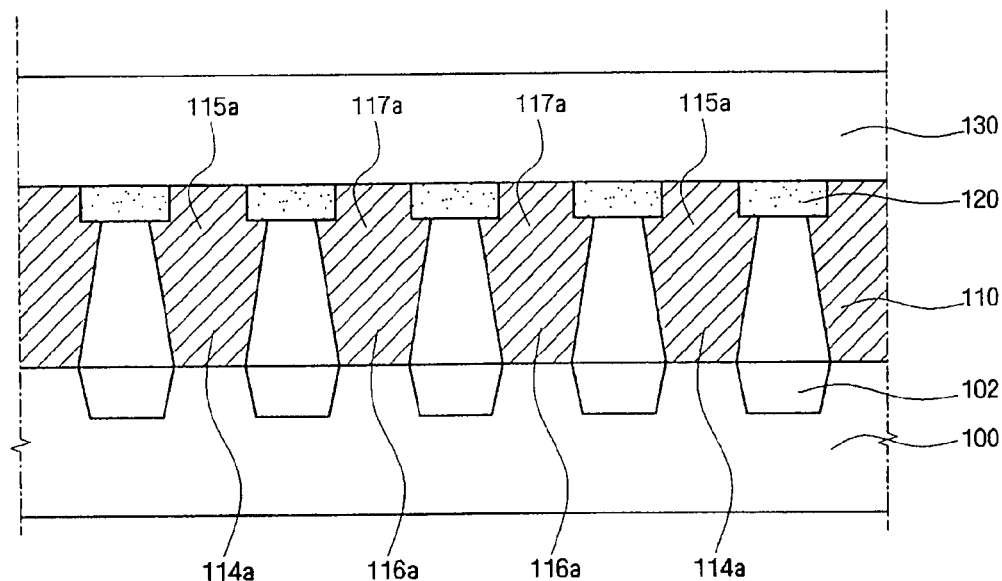

Next, as shown in FIG. 12, insulating material is deposited on the contact pad spacer 120 including the contact pads 114a and 116a and planarized so as to form the second interlayer insulating film 130. The second interlayer insulating film 130 may be formed of a silicon oxide film such as BPSG (BoroPhosphoSilicate Glass), PE-TEOS (Plasma Enhanced Tetra Ethyl Ortho Silicate) or HDP (High Density Plasma).

Figure 13:
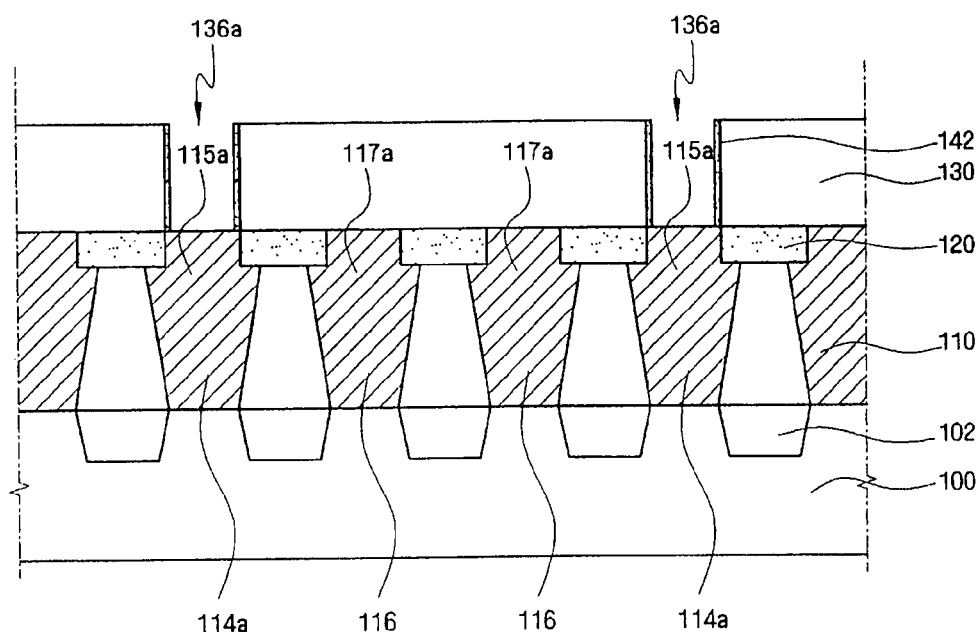

Next, as shown in FIG. 13, a general photolithography process is performed on the second interlayer insulating film 130 to form the bit line contact hole 136a through which the bit line contact pad 114a is exposed. In this case, the bit line contact hole 136a may be aligned on the reduced-size bit line contact pad, that is, the contact pad upper portion 115a. That is, the second interlayer insulating film 130 is dry-etched to form a contact hole 136a which exposes the surface of the reduced-size bit line contact pad 115a.

Next, the bit line contact spacer 142 may be formed on the entire surface of the resulting structure including the bit line contact hole 136a. The bit line contact spacer 142 may be, for example, a nitride film. For example, the bit line contact spacer 142 can be formed by depositing a silicon nitride film to have a thickness in the range of 100 to 300 Å.

Figure 14:
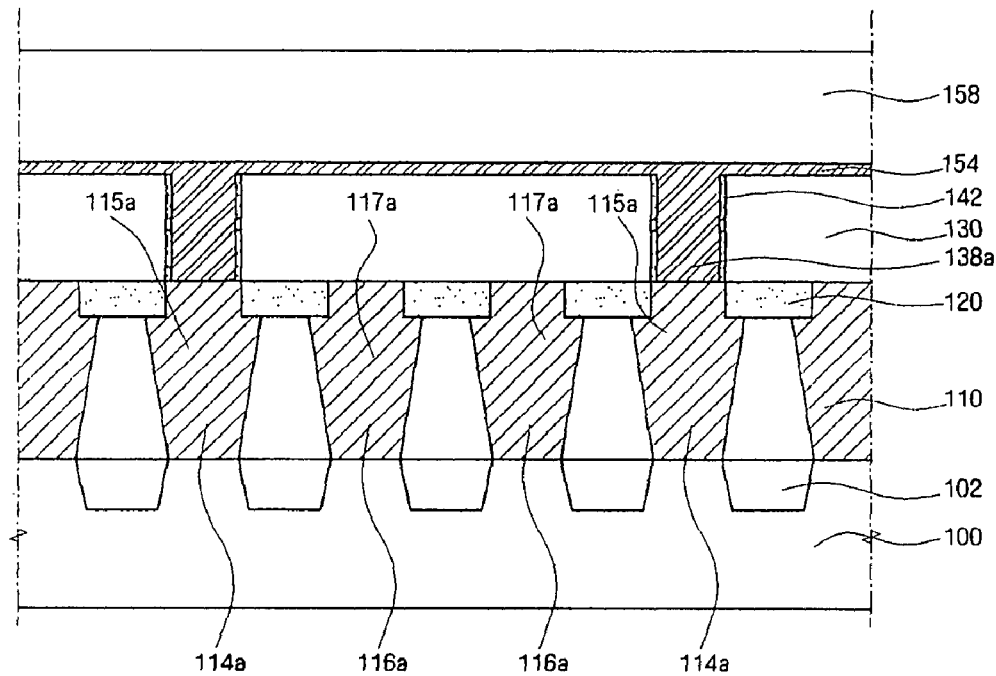

Afterwards, as shown in FIG. 14, the bit line contact plug 138a is formed by filling conductive material in the bit line contact hole 136a. In this case, the conductive material is formed to have a large thickness to cover the second interlayer insulating film 130 and then planarized to form the bit line conductive film 154.

To be more specific, the bit line contact plug 138a may be formed of a metal film, and a metallic material such as W, Cu or Al may be used. Before forming a metal film, a metal barrier film (not shown) may be formed to have a small thickness to prevent the metallic material from diffusing and to reduce contact resistance. The metal barrier film may be formed of any one selected from Ta, TaN, TaSiN, Ti, TiN, TiSiN, W, and WN or a mixture thereof. As such, if the bit line contact plug 138a is formed, metal silicide (not shown) may be formed on the interface between the metal barrier film and the reduced bit line contact pad 115a.

Figure 15:
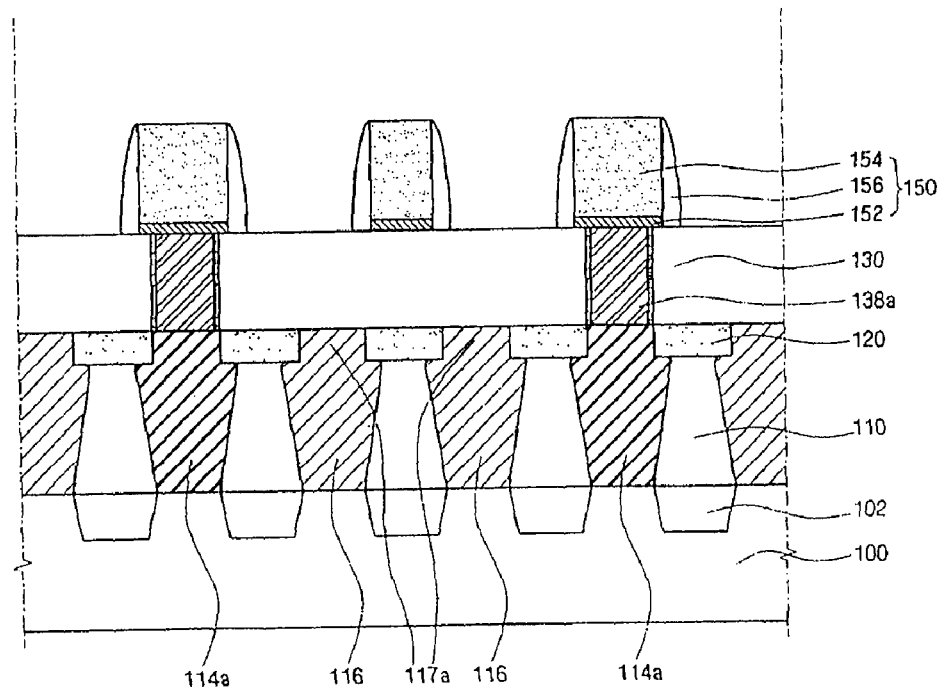

After forming the bit line conductive film 154, a nitride film is deposited on the bit line conductive film 154 to form the bit line capping film 158. Next, as shown in FIG. 15, the bit line capping film 158 and the bit line conductive film 154 are patterned so as to vertically extend to the gate lines 112, and a plurality of bit lines 150 that is electrically connected to a bit line contact plug 153 is formed. The bit line 150 includes a bit line spacer 156 at the side wall of the patterned bit line capping film 158 and bit line conductive film 154. The bit line spacer 156 can be formed by depositing a nitride film on the entire surface and performing an etch back after patterning the bit line capping film 158 and the bit line conductive film 154.

Figure 16:
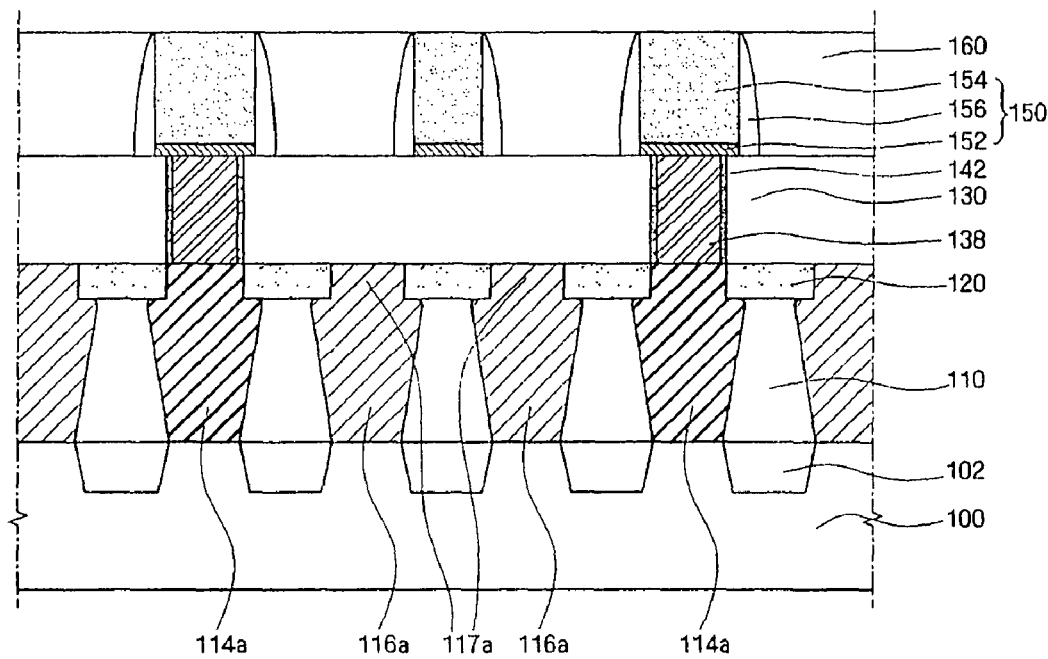

Afterwards, as shown in FIG. 16, after forming bit lines 130, insulating material for embedding the bit line 130 is deposited on the entire surface and planarized to form a third interlayer insulating film 160. The third interlayer insulating film 160 may be formed of a silicon oxide film such as BPSG (BoroPhosphoSilicate Glass), PE-TEOS (Plasma Enhanced Tetra Ethyl Ortho Silicate) or HDP (High Density Plasma).

Figure 17:
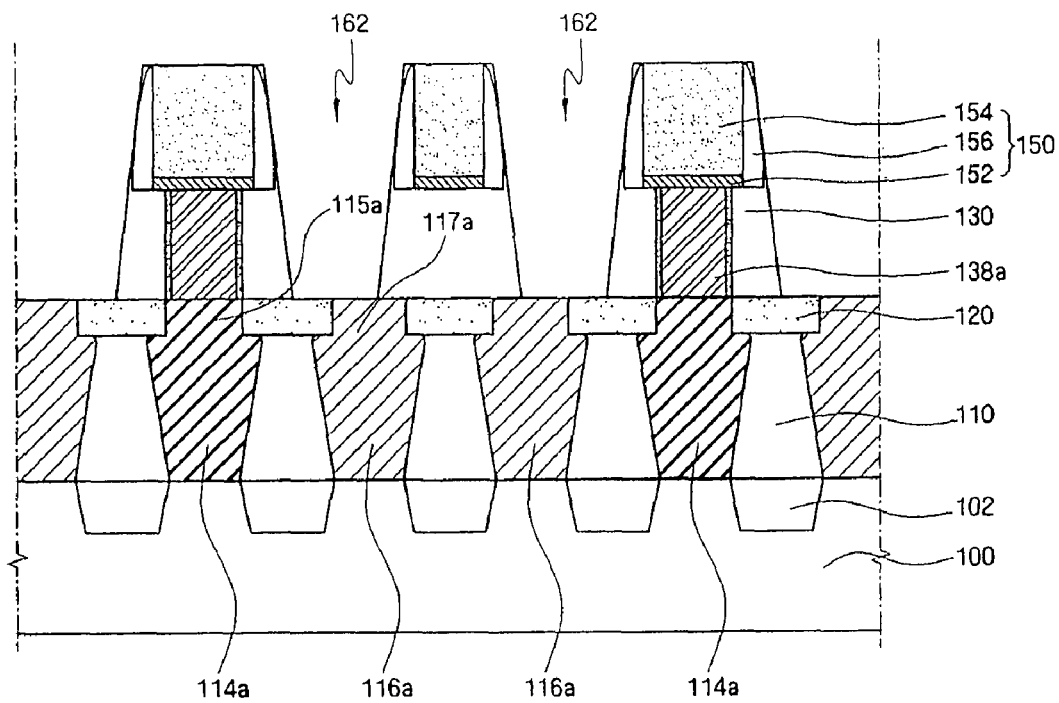

A mask (not shown) is formed on the third interlayer insulating film 160 to expose a storage node contact pad 116. Next, as shown in FIG. 17, a storage node contact hole 162 having a small width is formed to partially expose the storage node contact pad 116 by selectively dry-etching the second and third interlayer insulating film 130 and 160 using a mask (not shown). As the second and third interlayer insulating film 130 and 160 are dry-etched using the mask pattern, the storage node contact hole 162 has a large aspect ratio, thus, the width becomes smaller as its depth increases.

Therefore, to increase the exposed area of the storage node contact pad 116, a wet etching is performed on the storage node contact hole 176. In this case, as an etching liquid, a mixed solution of ammonia ($NH_4OH$), hydrogen peroxide ($H_2O_2$), and deionized water or fluoric acid solution (HF) may be used.

Figure 18:
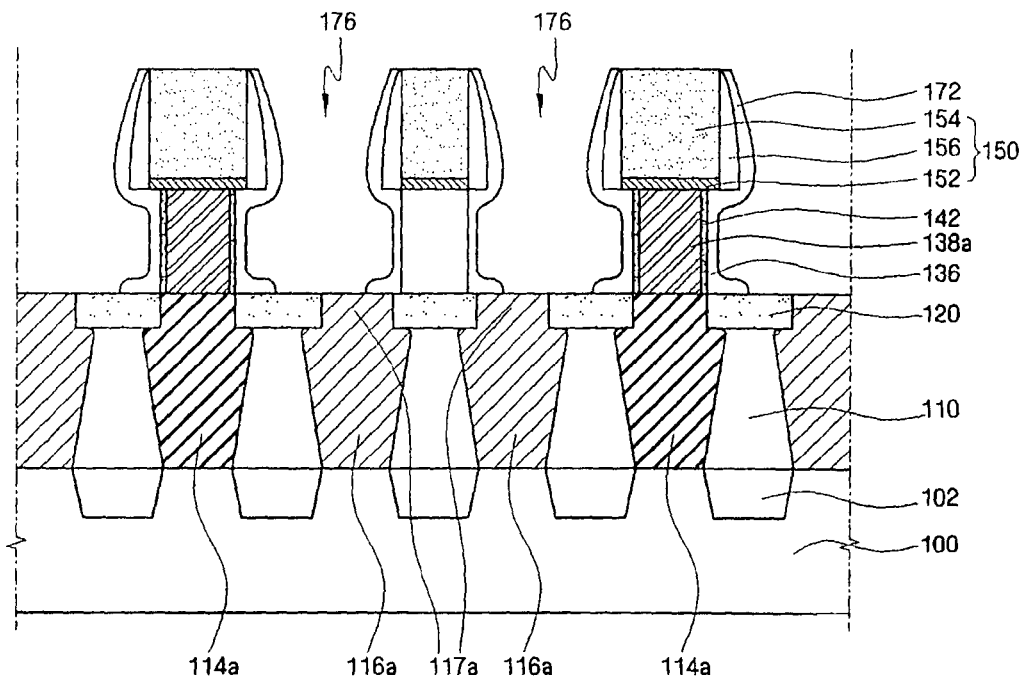

Accordingly, as shown in FIG. 18, the storage node contact hole 176 is formed to extend in a horizontal direction toward the bit line 150. In this case, the bit line contact plug 138a located in the second interlayer insulating film 130 is prevented from being damaged by an etching liquid with the help of the bit line spacer 142. Except for a portion of the upper side of the bit line contact pad 114 that is in contact with the bit line contact plug 153, the remaining portions are surrounded by the contact pad spacer 120 and the bit line contact spacer 142; therefore, it is possible to prevent the etching liquid from penetrating into the bit line contact pad 114.

By reducing the size of the contact pad 115a and 117a, particularly, the bit line contact pad upper portion 115a, the contact pad 115a, the contact pad 115a is further distanced from the storage node contact hole 176 by the reduced amount. As a result, a spatial margin necessary for the process of the semiconductor device increases, thus further reducing the likelihood of electrical defects such as short failures.

As such, after forming the storage node contact hole 176, the storage node contact spacer 172 is formed at the inner wall of the storage node contact hole 176. To be more specific, a spacer insulating film is conformally formed on the entire surface of the structure resulting from the formation of the storage node contact hole 176. The spacer insulating film may be formed of silicon nitride film (SiN) to have a thickness in the range of 100 to 300 Å. Afterwards, an etch back process is performed on the spacer insulating film which is conformally deposited to form the contact spacer 172 at the inner wall of the contact hole.

Afterwards, as shown in FIG. 2, conductive material or metallic material is filled in the storage node contact hole 176 and planarized to complete formation of the storage node contact plugs 178. As a result, while preventing damage to the bit line contact plug 138a, the storage node contact plug 178 having a larger contact area with the storage node contact pad. 116 can be formed. At the same time, it is possible to improve electrical defects that may occur between the storage node contact plug 178 and the bit line contact pad 114a by downsizing the size of a bit line contact pad to ensure a spatial margin between the storage node contact plug 178 and the downsized contact pad 115a.

Hereinafter, with reference to FIGS. 3, and 19 to 20, a method of fabricating a semiconductor device of FIG. 3 will be described. The same constituent elements of FIGS. 3, and 19 to 20 as those in FIGS. 1, 2, and 6 to 18 are denoted by the same reference numerals.

Figure 19:
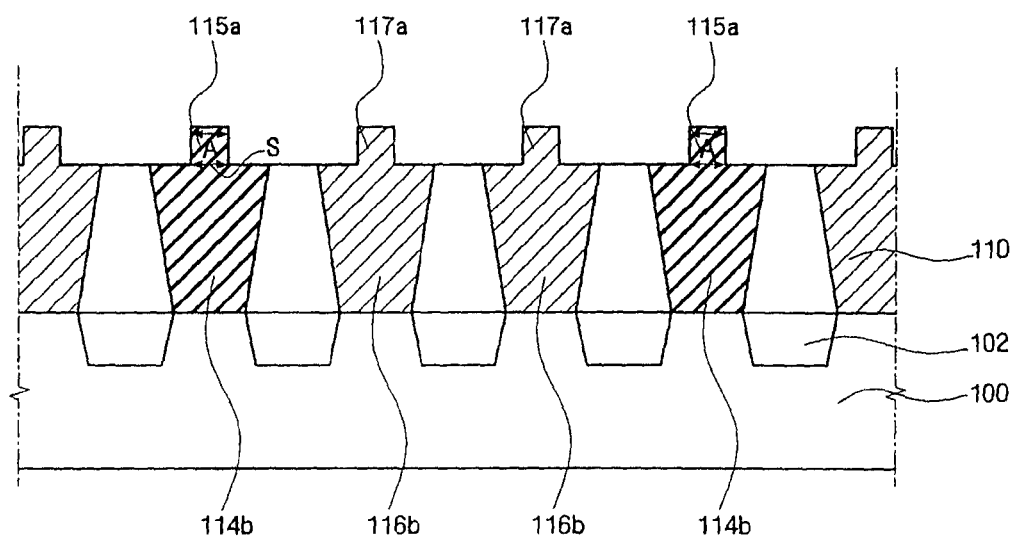
FIGS. 19 and 20 are cross-sectional views sequentially illustrating a method of fabricating the semiconductor device of FIG. 3.
Figure 20:
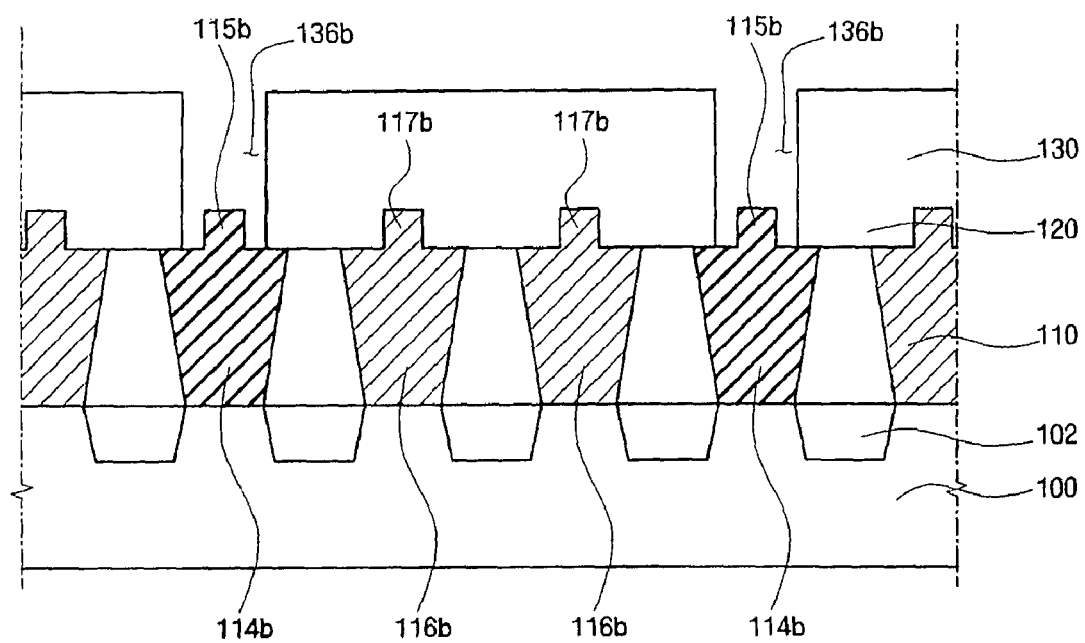

FIGS. 19 and 20 are cross-sectional views illustrating a process of fabricating, the semiconductor device of FIG. 3.

First, by performing the method of fabrication shown in FIGS. 6 to 11, a structure in which the first interlayer insulating film 110 is recessed to expose the contact pads 114b and 116a is formed. Afterwards, as shown in FIG. 19, the exposed contact pad is reduced in size. The embodiment is different from the first embodiment of the invention in that further reduction of the size of the exposed contact pad is performed, and therefore the size of the exposed contact pads 114b and 116b is further decreased. Next, the second interlayer insulating film 130 is formed and the bit line contact hole 136b is formed.

Unlike the semiconductor device according to the first embodiment of the invention in which the bit line contact plug 138a embedded in the bit line contact hole 136a and the bit line contact pad 114a exist on the same interface, the bit line contact hole 136b according to another embodiment of the invention may be formed inside the contact pad spacer 120. That is, the bit line contact hole 136b is formed such that a portion of the bit line contact hole extends into the second interlayer insulating film 130 and the contact pad spacer 120, and the bit line contact plug 138b is formed such that an extended portion of the bit line contact hole 136b is embedded. The bit line contact plug 138b surrounds the downsized contact pad 115b formed inside the contact pad spacer 120, and the contact pad spacer surrounds the bit line contact plug 138b surrounding the downsized contact pad 115b. As a result, the contact area between the bit line contact plug 138b and the contact pad upper portion 115b increases, thus reducing resistance.

The semiconductor devices shown in FIGS. 4 and 5 may be optionally formed, in other embodiments, as the first interlayer insulating film 110 is recessed and downsized in size such that the cross-section of the contact pad cut perpendicular with respect to the substrate 100 has a trapezoidal shape. In other words, the size reduction operation is performed such that the cross-sectional area of the contact pad upper portions 115c and 115d gradually decreases as with increased vertical distance from the substrate 100. The shape of the contact pad upper portions 115c, 115d, 117c, and 117d may be formed by controlling conditions such as etchant, etching temperature, etching time as a whole, as known in the semiconductor arts.

As shown in FIG. 5, when the contact pad upper portion 115d is formed, since the cross-section cut perpendicular with respect to the substrate 100 has trapezoidal shape, the interface in contact with the bit line contact plug 138d increases, thus reducing resistance.

Although embodiments of the present invention have been described in connection with exemplary embodiments, it will be apparent to those skilled in the art that various modifications and changes may be made thereto without departing from the scope and spirit of the invention. Therefore, it should be understood that the above embodiments are not limitative, but rather are illustrative in all aspects.

As described above, according to the semiconductor device and the method of fabricating the same, the side surface of the contact pad upper portion is perpendicular to the substrate, or the cross-section cut perpendicular with respect to the substrate has a trapezoidal shape, thus, it is possible to ensure a sufficient margin between the bit line contact pad and the storage node contact. Therefore, it is possible to reduce the likelihood of electrical defects that may result from the small-sized spatial margin. In addition, it is possible to reduce resistance by increasing the interface between the bit line contact plug and the bit line contact pad.

What is claimed is:

1. A semiconductor device comprising:
   a first interlayer insulating film including a first insulating pattern and a second insulating pattern being adjacent to the first insulating pattern and formed on a semiconductor substrate;
   a contact pad spacer including a first spacer pattern formed on the first insulating pattern and a second spacer pattern formed on the second insulating pattern; and
   a contact pad including a first portion formed between the first insulating pattern and second insulating pattern, and a second portion formed between the first spacer pattern and second spacer pattern,
   wherein a width of an upper portion of the second portion of the contact pad is less than a width of a lower portion of the second portion of the contact pad, and
   wherein a top surface of the second portion of the contact pad and a top surface of the contact pad spacer are disposed at the same plane.

2. The semiconductor device of claim 1, wherein a side surface of the upper portion of the second portion is perpendicular to the substrate.

3. The semiconductor device of claim 1, wherein a cross-section of the upper portion of the second portion in a direction perpendicular to the substrate has a trapezoidal shape.

4. The semiconductor device of claim 1, further comprising:
   a second interlayer insulating film on the contact pad spacer and the contact pad;
   a bit line contact hole in the second interlayer insulating film;
   a bit line on the second interlayer insulating film and electrically connected to a bit line contact plug embedded in the bit line contact hole;
   a third interlayer insulating film on the bit line;
   a storage node contact hole in the second interlayer insulating film and the third interlayer insulating film; and
   a storage node plug embedded in the storage node contact hole.

5. The semiconductor device of claim 4, wherein:
   at least a portion of the bit line contact hole extends into the contact pad spacer, and
   the bit line contact plug is embedded in the partially extended bit line contact hole, and surrounds the second portion.

6. The semiconductor device of claim 5, wherein a side surface of the upper portion of the second portion is substantially perpendicular to the substrate.

7. The semiconductor device of claim 5, wherein a cross-section of the upper portion of the second portion in a direction perpendicular to the substrate has a trapezoidal shape.

8. The semiconductor device of claim 4, wherein an interface between the bit line contact plug embedded in the bit line contact hole and the contact pad is a substantially uniform, flat surface.

9. The semiconductor device of claim 8, wherein a cross-section of the upper portion of the second portion in a direction perpendicular to the substrate has a trapezoidal shape.

10. The semiconductor device of claim 8, wherein a side surface of the upper portion of the second portion is substantially perpendicular to the substrate.

11. The semiconductor device of claim 1, wherein the contact pad spacer is formed of a nitride film.

12. A semiconductor device comprising:

a semiconductor substrate;

a first interlayer insulating film including a first insulating pattern and a second insulating pattern on the substrate, the second insulating pattern being adjacent to the first insulating pattern;

a contact pad spacer including a first spacer pattern on the first insulating pattern and a second spacer pattern on the second insulating pattern;

a contact pad having a first portion formed between the first insulating pattern and second insulating pattern, and having a second portion formed between the first spacer pattern and second spacer pattern, wherein side surfaces of the second portion of the contact pad that face side surfaces of the first and second spacer patterns are separated from the side surfaces of the first and second spacer patterns by a predetermined distance.

13. The semiconductor device of claim 12 further comprising a bit line contact plug on the contact pad, the bit line contact plug surrounding the side surfaces of the second portion of the contact pad.

14. The semiconductor device of claim 12, wherein the side surfaces of the second portion of the contact pad are perpendicular to a top surface of the substrate.

15. The semiconductor device of claim 12 further comprising:

a second interlayer insulating film on the first interlayer insulating film;

a bit line contact hole in the second interlayer insulating film, the bit line contact hole extending into a region between the side surfaces of the first and second spacer patterns ; and a bit line contact plug in the bit line contact hole, wherein the bit line contact plug fills a region of the contact hole between the side surfaces of the second portion of the contact pad and the side surfaces of the first and second spacer patterns such that the bit line contact plug surrounds the side surfaces of the second portion of the contact pad.

16. the semiconductor device of claim 15 further comprising:

a bit line on the second interlayer insulating film and electrically connected to a bit line contact plug;

a third interlayer insulating film on the bit line;

a storage node contact hole in the second interlayer insulating film and the third interlayer insulating film ; and a storage node plug embedded in the storage node contact hole.

* * * * *